United States Patent [19]

Demeester et al.

[11] Patent Number: 5,108,947
[45] Date of Patent: Apr. 28, 1992

[54] INTEGRATION OF GAAS ON SI SUBSTRATES

[75] Inventors: Piet M. Demeester; Ann M. Ackaert, both of Gent; Peter P. Van Daele, Aalst; Dirk U. Lootens, Deinze, all of Belgium

[73] Assignee: AGFA-Gevaert N. V., Mortse, Belgium

[21] Appl. No.: 470,356

[22] Filed: Jan. 25, 1990

[30] Foreign Application Priority Data

Jan. 31, 1989 [EP] European Pat. Off. ............ 89200205

[51] Int. Cl.$^5$ .................................... H01L 21/20
[52] U.S. Cl. ........................... 437/89; 148/DIG. 26; 148/DIG. 97; 156/613; 437/132; 437/939; 437/962
[58] Field of Search ............... 148/DIG. 17, 26, 50, 148/56, 65, 72, 95, 97, 106, 110, 127, 149, 169, 33, 33.2, 33.3, 33.4; 156/610–614; 427/248.1, 255.1; 437/81, 83, 89, 90, 99, 105, 107, 126, 129, 132, 936, 939, 946, 947, 962

[56] References Cited

U.S. PATENT DOCUMENTS

| | | | |
|---|---|---|---|
| 4,774,205 | 9/1988 | Choi et al. | 437/90 |
| 4,826,784 | 5/1989 | Salerno et al. | 437/126 |
| 4,914,053 | 4/1990 | Matyi et al. | 437/132 |
| 4,925,810 | 5/1990 | Kano et al. | 437/90 |
| 4,940,672 | 7/1990 | Zavracky | 437/132 |

FOREIGN PATENT DOCUMENTS

| | | | |
|---|---|---|---|
| 0098823 | 6/1980 | Japan | 437/132 |
| 0189619 | 8/1986 | Japan | 437/132 |
| 0213117 | 9/1987 | Japan | 437/132 |
| 0090518 | 4/1989 | Japan | 437/132 |

OTHER PUBLICATIONS

Yacobi et al., "Stress Variations and Relief in Pattern GaAs . . .", Appl. Phys. Lett., 52(7), Feb. 15, 1988, pp. 555–557.

Li et al., "Aspects of Selective Areas Growth . . .", J. Electrochem. Soc., vol. 130, No. 10, Oct., 1983, pp. 2072–2075.

Deppe et al., "Effects of Microcracking on . . . GaAs Quantum Well Lasers Grown on Si", Appl. Phys. Lett., 53(10), Sep. 5, 1988, pp. 874–876.

Soga et al., "Selective MOCUD Growth of GaAs on Si . . .", Jpn. J. Appl. Phys., vol. 26, No. 2, Feb. 1987, pp. 252–255.

*Primary Examiner*—Olik Chaudhuri
*Assistant Examiner*—William D. Bunch
*Attorney, Agent, or Firm*—William J. Daniel

[57] ABSTRACT

A method of growing a GaAs crystalline layer on a Si substrate by means of which mechanical stresses causing microcracks in the materials when cooled due to the difference in their thermal coefficients are reduced and the location of the microcrack is controlled to predetermined sites. Microcracks are deliberately induced in the GaAs layer at locations where the operation of the ultimate electronic device created on the material is not affected by applying to the substrate a SiO$_2$ mask providing a deposition opening or window for the GaAs layer, which masks defines along the opening boundary at least one vertex in the cleavage direction of the GaAs crystals. The vertices in the mask create notches in the periphery of the deposited layer which determines the location of any microcracks.

19 Claims, 8 Drawing Sheets

INTEGRATION OF GAAS ON SI SUBSTRATES

BACKGROUND OF THE INVENTION

1. Field of the invention

The present invention relates to the integration of GaAs on a Si substrate.

The invention more specifically relates to the monolithic integration of GaAs/AlGaAs electronic or optoelectronic structures such as light emitting diodes on a Si substrate on which Si electronic circuitry such as LED-drivers (field effect transistors) can also be integrated.

2. Description of the prior art ( GaAs layers or GaAs structures, i.e. GaAs/AlGaAs light emitting diodes can be grown substantially free of stresses on top of a Si substrate, usually in wafer form, at high temperature, i.e. 700° C.

However, during the cooling-off period the different shrinkage of GaAs and Si brings about stresses in the materials.

These stresses may cause the wafer to bend if the thickness of the GaAs layer grown on the Si substrate is rather small, e.g. when this thickness does not exceed 3 micrometer.

If the GaAs layer is thicker, microcracks might appear in the epitaxial layer structure on the wafer.

The presence of material stresses affects negatively the electrical and/or optical properties of the GaAs/Si devices. Material warpage hinders lithography and further processing of the wafer. The randomly occurring microcracks might also interfere with the proper operation of the electronic devices that are ultimately formed.

The above issues of concern that arise when growing GaAs layers on Si substrates are described in the following publications: "Stress variations due to microcracks in GaAs grown on Si" published by B.G. Yacobi et al. in Appl. Phys. Lett. Vol. 51, No. 26 and "Stress variations and relief in patterned GaAs grown on mismatched substrates" by B.G. Yacobi et al. in Appl. Phys. Lett. Vol. 52, No. 7.

Few solutions have been proposed in the art to deal with the above problems. In Appl. Phys. Lett., Vol. 53, No. 3 a paper on "The warpage of GaAs-on-Si wafers and its reduction by selective growth of GaAs through a silicon shadow mask by molecular beam epitaxy" was published. The warpage of fully covered GaAs-Si wafers and of Si wafers with selective growth of GaAs (obtained by using a Si shadow mask) have been studied. A significant reduction in warpage is observed by restricting the growth area of GaAs.

It is also known to provide the back side of the silicium substrate with a film in order to counteract the stresses that are induced by the GaAs epitaxial layer.

SUMMARY OF THE INVENTION

It is an object of the present invention to provide method of growing GaAs on a Si substrate which achieves a reduction of stresses in the final laminate resulting from the difference of the thermal expansion coefficients of these materials during cooling.

A further object of the invention is to provide a method of growing GaAs on a Si substrate as a result of which planar (flat) wafers are obtained so that subsequent lithographic operations are not hindered.

Still a further object of the present invention is to provide a method of integrating GaAs electronic or optoelectronic devices on a Si substrate so that no microcracks occur inside the active area of the devices. Other objects will become apparent from the description hereinafter.

The present invention provides method of forming an integrated electronic device or a part thereof by growing GaAs on a Si substrate at a given temperature and subsequent cooling of the substrate characterised in that microcracks are deliberately induced in said GaAs layer at locations where the operation of said device or part thereof is not affected.

By intentionally created microcracks in inoperative regions of an integrated device according to the present invention, stresses in the materials can be reduced and the occurrence of microcracks at random locations can be avoided To achieve the above microcracks at locations where the operation of the devices or part thereof is not affected, part of the substrate is covered with a mask prior to the deposition of GaAs. The mask is preferably a $SiO_2$ mask.

It has been found that by using a specific topography or configuration of the mask (as will be explained further on with reference to the drawings) microcracks can be induced at predetermined desired locations.

By use of a mask provided with at least one vertex or point directed in a cleavage direction of the GaAs crystal, microcracks are induced in the monocrystalline layer initiating from said vertex and propagating in said cleavage direction.

Thus, the present invention further generally provides a method of forming microcracks at predetermined locations in a GaAs layer grown on a Si substrate characterised in that prior to the growth of said GaAs layer said Si substrate is partially covered by means of a mask, said mask being designed (shaped) with at least one vertex i.e. an interiorly projecting sharp point, extending at least approximately in a cleavage direction of the crystals of said GaAs layer.

A mask topography, more specifically the location and the number of vertices created thereby can be selected so that microcracks can be deliberately induced at predetermined locations.

A so-called vertex acts in response to applied mechanical stresses as a wedge that cleaves the GaAs crystal and hence is also called "wedge".

In a first step $SiO_2$ is deposited for example by plasma enhanced chemical vapour deposition (PECVD) on the Si substrate.

Regions of the $SiO_2$ layer are removed again by photolithography and wet chemical etching so as to form a mask.

Next, on the resultant partially coated Si substrate GaAs is deposited for example by means of the metal organic chemical vapour deposition technique (MOVCD) which in known in the art.

According to this technique GaAs is deposited on Si in a quartzreactor. The metalorganic source trimethylgallium $(CH_3)_3Ga$ can for example be used to transport a group III component, viz. Ga, using hydrogen as a carrying gas.

Arsine can be used for transporting the group V element As.

Hydrogenselenide can be used to obtain n-type doping and diethylzinc (transportation vapour hydrogen) can be used to obtain p-type doping. The above sources are heated in a quartzreactor.

By the following simplified pyrolithic reaction at 700° C., GaAs is deposited on a Si substrate present in the reactor.

$$(CH_3)_3Ga + AsH_3 \rightarrow GaAs + 3CH_4 \text{ at } 700° C.$$

The morphology of the GaAs that is deposited depends among others on the characteristics of the underlying material.

Monocrystalline GaAs is obtained on non-coated Si area whereas on the SiO₂ mask polycrystalline GaAs deposition is found.

By using a specific mask configuration creating sharp notches in the deposited layer regions according to the present invention, upon cooling, microcracks are introduced in the monocrystalline GaAs initiating from the vertices and propagating in at least one cleavage direction. No microcracks are found in other regions of the layer.

BRIEF DESCRIPTION OF THE DRAWINGS

For a better understanding of the present invention and of the preferred embodiments thereof, reference is made to the following detailed description given in connection with the accompanying drawings and pictures, in which FIG. 1 schematically shows the topography of a GaAs/AlGaAs light emitting diode and a field effect transistor (MOSFET) that are monolithically integrated on a Si substrate.

On the silicon substrate a GaAs buffer layer is first grown. On top of said GaAs buffer layer, a AlGaAs cladding layer, an active GaAs or AlGaAs layer, a second AlGaAs cladding layer and finally a GaAs contact layer are grown.

Figure 1:
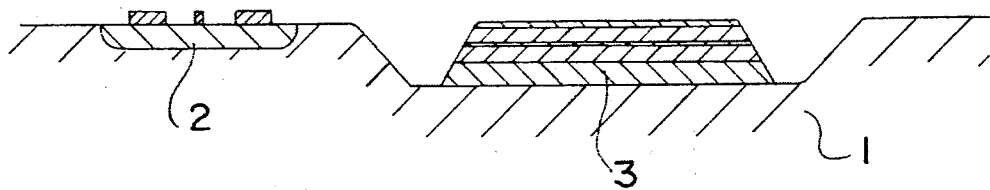
FIG. 1 shows an example of a device that is composed of a first component which is a Si circuit more specifically a field effect transistor 2 and a second component that is a GaAs component, namely a light emitting diode 3. Both components are integrated on a common silicium substrate 1. Light emitting diode 3 comprises 5 layers grown on top of each other.
Figure 2:
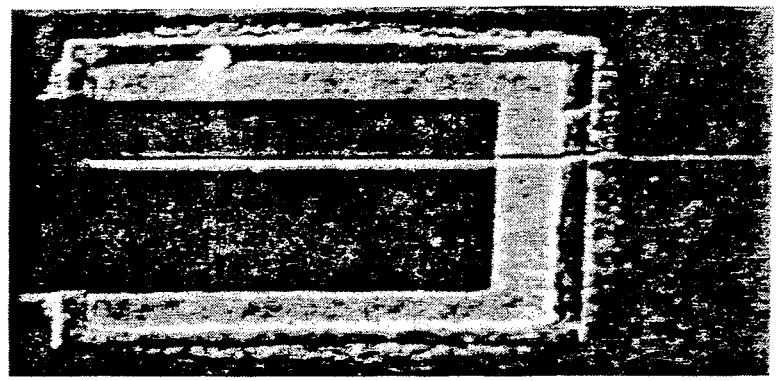
FIG. 2 is a reproduced photograph showing a spontaneously and randomly originated microcrack, FIG. 3 schematically illustrates the locations of intentionally induced microcracks on a substrate on which electronic or optoelectronic devices are grown.

FIG. 2 shows a random microcrack that is originated spontaneously in a GaAs/AlGaAs layer structure deposited on a Si substrate. Unfortunately, this microcrack extends through the operational part of the GaAs light-emitting diode and makes the device useless (photograph taken by means of an electron microscope).

Due to different shrinkage of GaAs and Si during the cooling off period from the temperature at which GaAs is grown on the Si substrate to operational temperature (room temperature), microcracks such as illustrated by this reproduced photograph can originate at random locations and can ruin the operation of the device.

Figure 3:
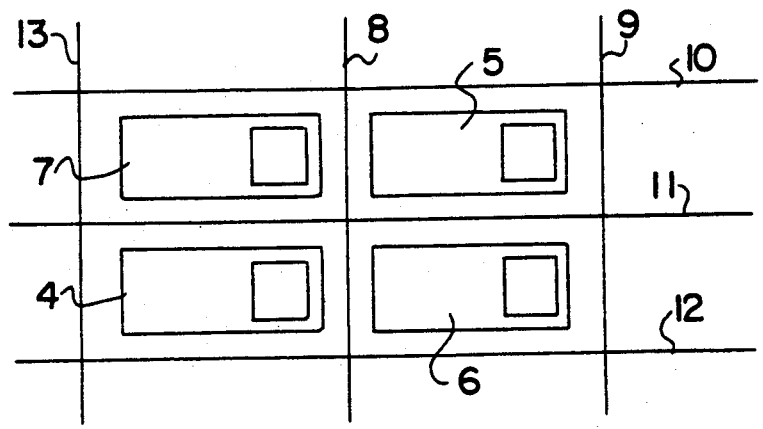

This problem is solved by the method of the present invention according to which microcracks are intentionally created so that material stresses are reduced and so that the exact position of the microcracks can be controlled so as to prevent generation of a microcrack at an operationally significant region within a device. FIG. 3 illustrates that microcracks can be created on locations outside the active regions of the devices. FIG. 3 schematically shows a series of light emitting diodes 4, 5, 6 and 7 integrated on a common substrate. The drawn lines numbered 8 to 13 represent the locations on which microcracks could for example be formed outside the devices so as not to affect their operation.

In order to obtain said microcracks at the locations which will not adversely affect the device operation the following procedure is followed.

The silicium substrate (14) is initially covered by a mask, preferably a SiO₂ mask (15), by means of deposition as known of SiO₂ on the Si-substrate (FIG. 4) and removal of a region of the SiO₂ layer by photolithography and wet chemical etching.

Figure 4:
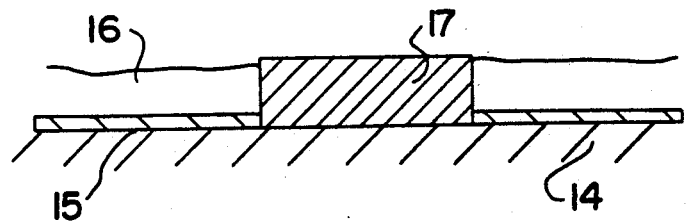
FIG. 4 illustrates the use of a SiO₂ mask and the growth of GaAs on the wafer.

Next, GaAs is deposited as a layer. In FIG. 4 the different morphology of GaAs on different surface regions is shown. The morphology of GaAs deposited on SiO₂ regions is polycrystalline (16), whereas on the Si-substrate regions (not covered by SiO₂) it is monocrystalline (17).

The following is a description of a specific procedure of forming a mask according to the present invention. The mask used in the experiments described further on have been obtained by using this particular procedure. The masking layers can for example be plasma-deposited on Si-wafers (p⁻, (100)+3° towards perpendicular [0 1 1] direction) using Plasma Enhanced Chemical Vapour Deposition.

According to a preferred embodiment of the present invention, the wafers are cleaned in a mixture of 50% HF-solution and deionisised water DI (1 part/19 parts) for 15 seconds prior to the deposition process. Then the wafers are loaded into the vacuum chamber of a PD80-system (Plasma Technology).

The parameters of the deposition process leading to a deposition rate of 33 nm/min and deposition of a layer of 100 nanometer, are the following:
total pressure in the chamber: 500 m Torr,
temperature of the sample: 300° C.,
RF-power: 25 W,
RF-frequency: 100 kHz,
gasflow: 10 sccm SiH₄, 120 sccm N₂O,
duration: 3 min.

For the patterning of the SiO₂-layers a standard photolithographic process is used. The wafers are cleaned in boiling solvents in soxhlets (15 min trichloroethylene, 15 min in acetone, 15 min in isopropylalcohol). Then the wafers are rinsed in deionised water (DI) and dried in air at a temperature of 120° C. for 30 min.

After drying, the samples are spincoated (3000 rpm, 40 sec) with photoresist. For these experiments AZ1350-resist (Shipley) is used. The resist is baked for 5 min in a hot-plate furnace at 90° C. in a nitrogen atmosphere.

Figure 7:
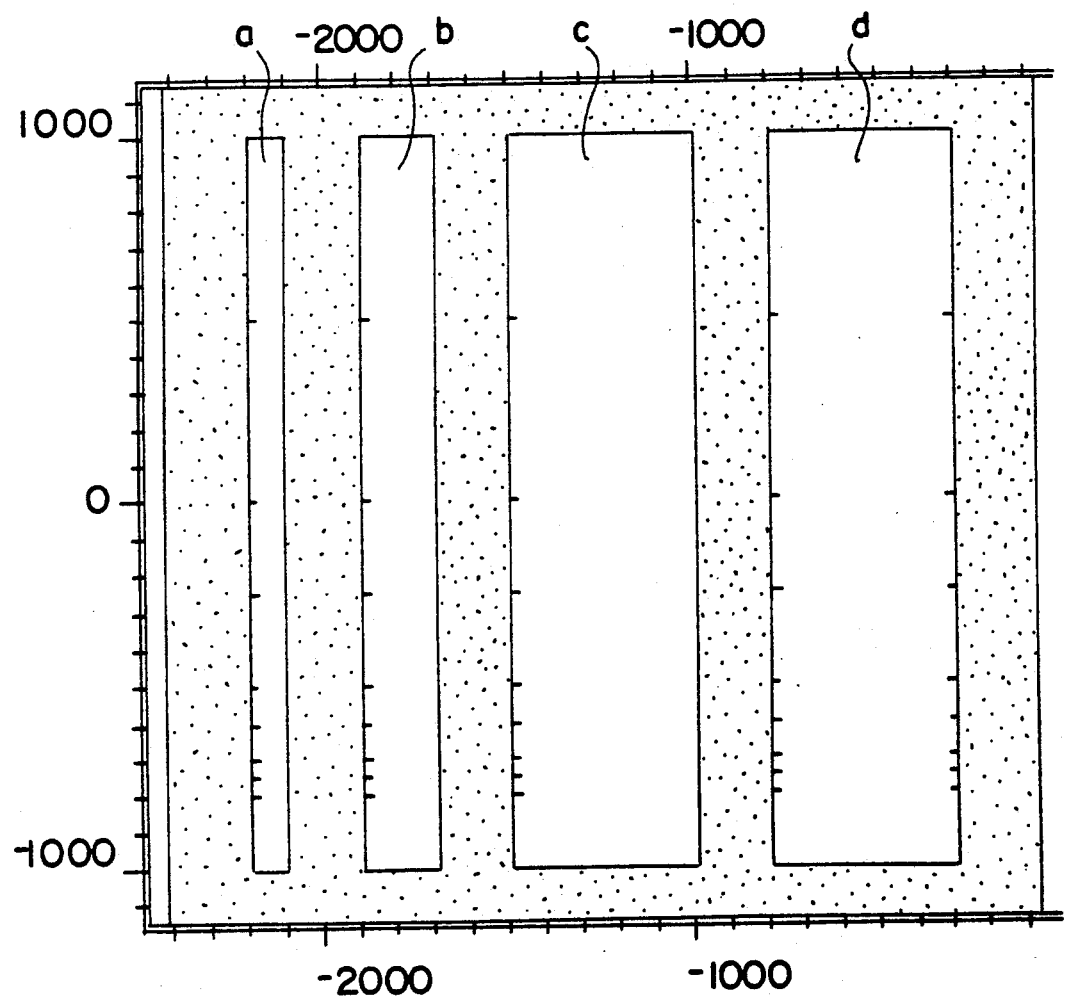
FIG. 7 and 8 illustrate different kinds of masks.

The resist is then exposed to UV (high pressure Hg-lamp) in a mask-aligner through a mask such as illustrated in FIG. 7. (Exposure time: 34 sec)

The exposed areas are developed. (developer: diluted AZ 2401 developer (Shipley), dilution: 1 part AZ 2401, 4 parts DI, developing time: 30 sec). With the photoresist as a mask, the SiO$_2$-layer is etched away. (etching solution: BHF from Transene, etching during 50 sec).

The next step is the epitaxial growth of GaAs as a layer by means of the metal organic chemical vapour deposition method (in a Thomas Swan Epitor 04 system).

The used reactor accommodates four metalorganic sources and three hydrides. As carrier gases nitrogen (inert) and Pd-purified hydrogen can be selected by bellows sealed pneumatic valves. Temperature controlled baths are included in each metalorganic line. The gas flow in each line is controlled by MKS mass flow controllers. The system is equipped with a EPI-FOLD fast switching gas manifold for deposition of abrupt interfaces. The growth can be controlled manually or by computer.

The reactor is a horizontal quartzreactor with a rectangular cross section and working at atmospheric pressure. During growth the substrates lay on top of a rectangular Si-susceptor, which is heated by an IR-lamp (1000 W, 110 V). The temperature is measured by means of a thermocouple placed in the Si-susceptor and through a PID regulator the lamppower is continuously adjusted.

The available sources are trimethylgallium (TMG), trimethylaluminium and diethylzinc for the metalorganics and 5% AsH$_3$ (arsine) in hydrogen, 200 ppm SiH$_4$ (silane) and 200 ppm H$_2$Se (hydrogen selenide), both diluted in hydrogen. Normal growth conditions are $T_{gr}$=660° C., growth velocity=100 nm/min, mol fraction (TMG)=2.10$^{-4}$, mol fraction (AsH$_3$)=2.10$^{-3}$.

Preferably a substrate preparation step for the growth of GaAs on Si is included. This step consists of an ex situ etch procedure of 15 sec in a HF:DI 1:19 mixture followed by rinsing under flowing DI (18,03 MOhm) for 60 sec and blowing dry in N$_2$ flow.
(HF solution: 49%–51%).

After the in situ bake-out, the substrate is cooled to 450° C. and the H$_2$ carrier flow is raised to 4.4 1/min. When the temperature is stabilized at 450° C. the growth environment is flushed with 200 cc/min AsH$_3$ (5% in H$_2$) flow during 2 min.

Immediately after this etching procedure the substrate is loaded into the reactor. The in situ substrate preparation consists of a bake-out procedure at 950° C. under a 1 1/min H$_2$ flow during 1 hour.

Immediately hereafter the trimethylgallium flow is switched to the reactor and a thin GaAs nucleation layer (about 10 nanometer) is grown during 60 sec. Under a continued AsH$_3$ flow the set-point of the reactor heating is set at 720° C. After 5 min., the read-out value of the temperature being approximately 700° C., the set-point is gradually decreased to 660° C. (normal growth temperature). After an extra 5 min, the read-out value of the temperature being stabilized at 660° C., the growth of the wanted GaAs/AlGaAs structure is started.

The deposition on the quartz-reactor wall has to be removed after each growth run of GaAs on Si. In order to prevent desorption of this deposition an AsH$_3$ overpressure is required during the in situ bake-out step for the substrate preparation of the second growth run of GaAs on Si. At the elevated temperatures needed (950° C.), the AsH$_3$ cracks too fast so that the dust filter at the outlet of the reactor becomes clogged and eventually causes a pressure built-up in the growth environment.

At every growth run the quartz reactor is removed from the system and replaced by a clean one. The first reactor and susceptor are then etched in aqua regia, rinsed in overflowing Di and in isopropylalcohol. After a bake-out for several hours at 100° C. in vacuum furnace, the reactor-susceptor combination is replaced in the system and heated up to 850° C. under a H$_2$ flow of 2.2 1/min for at least one hour. The etched reactor is ready for the following growth run of GaAs on Si.

For the intentional creation of microcracks on specific locations (where no operative devices are present), the configuration of the SiO$_2$ mask is of particular importance.

For this purpose the SiO$_2$ mask defines at least one vertex i.e., point or angle, directed towards a cleavage direction of the GaAs crystal (namely the [0 1 1] or [0 1 1] direction). In a particular embodiment each vertex is symmetrical relative to one such direction.

Figure 5:
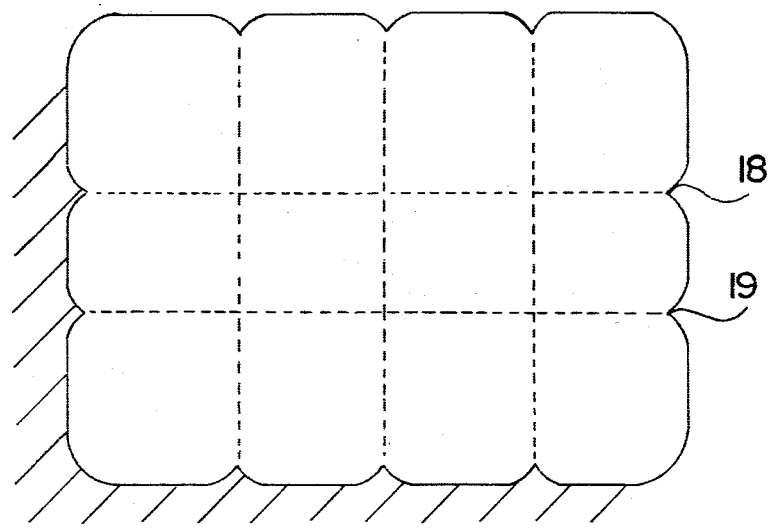
FIG. 5 represents a mask that can be used for obtaining deliberated induced microcracks.

An example of such a mask is shown in FIG. 5. The shaded part represents the substrate covered by a SiO$_2$ mask. Inside the border of the SiO$_2$ mask, on the uncovered substrate (also called window), active electronic devices can be fabricated.

Vertices (for example being indicated by numerals 18 and 19) in the periphery of the SiO$_2$-mask around the window are directed towards one cleavage direction of the crystal namely towards the [0 1 1] or the [0 1 1] direction. As a result of said vertices in the mask periphery, microcracks appear in determined locations in the GaAs layer deposited in the opening in the mask. These microcracks extend into the cleavage directions of the crystal (shown by the dashed lines in FIG. 5). The microcracks diminish the mechanical (cooling) in the material stresses on the one hand but do not affect the device operation since their location is substantially fixed and devices can be fabricated locally so that these microcracks are situated outside the operationally active regions.

Figure 8:
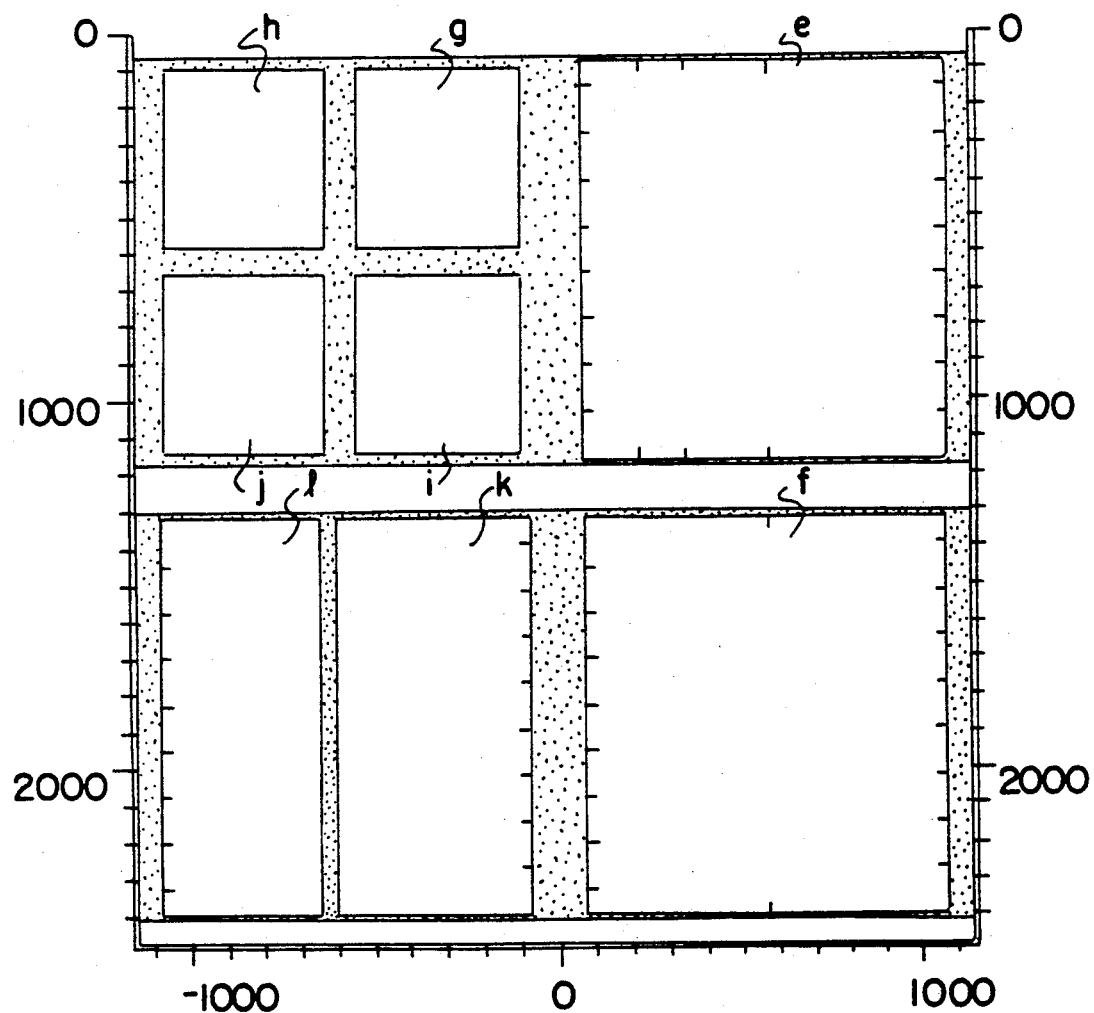

FIG. 5 represents one possible mask topography. Other configurations are possible, other examples are illustrated in FIGS. 7 and 8. It will be clear that at least one vertex or notch directed into the crystals cleavage direction is required to obtain the controlled induced microcracks according to the present invention.

Figure 6:
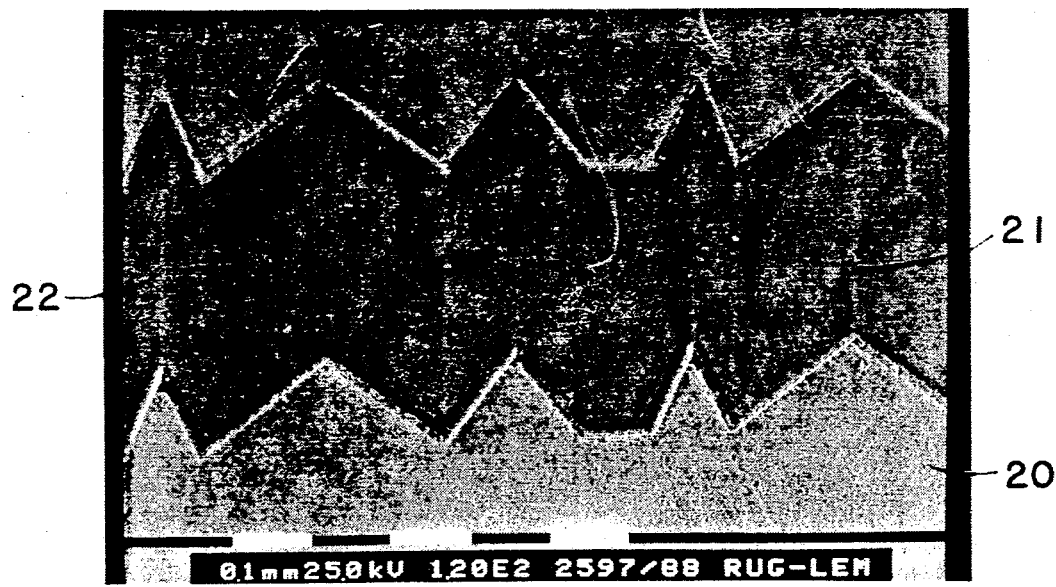
FIG. 6 is a reproduced photograph showing induced microcracks.

FIG. 6 is a reproduced photograph showing a Si substrate partially covered by a SiO$_2$ mask 20 having roughly zig-zag boundaries defining plural vertices or angles. Microcracks extend from one vertex to an opposite vertex. The microcracks extend in the cleavage direction of the crystal. Microcracks (very fine vertical lines on the reproduced photograph) are for example indicated by the numerals 21 and 22.

FIGS. 7 and 8 illustrate different kinds of masks, dimensions are given in micrometers.

FIG. 7a, b, and c, represent masks in which the vertices have the same shape and the same location, only the width of the opening (or window) in the mask is changed.

The influence of the spacing of the different vertices can also be analyzed by means of this mask.

The distance in between the vertices is varied between 50 micrometer and 500 micrometer, the width of the window is varied between 100 and 500 micrometer.

FIGS. 7d, FIGS. 8e and f illustrate masks in which vertices are located on different sides (opposite sides as well as perpendicular sides) of the window in the mask. In FIG. 8e the shape of the vertices is also changed.

FIGS. 8*l* and *k* represent masks having vertices on one side, the vertices are equidistant. In FIG. 8*l*, the shape of the vertices is not identical.

FIGS. 8*g* and *j* represent masks in which several different configurations of vertices are formed in the respective central parts of the opening in the mask (cross form, linear or slit form, rhomb-shaped).

Figure 9:
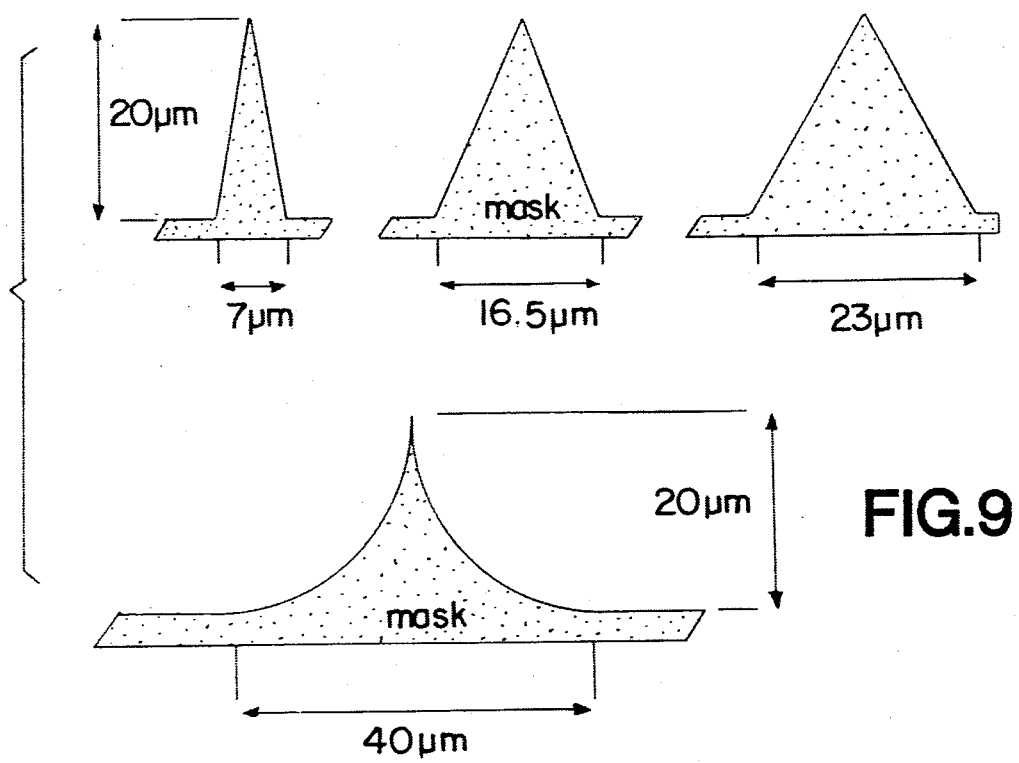
FIG. 9 is an enlarged representation of different shapes of vertices.
Figure 10:
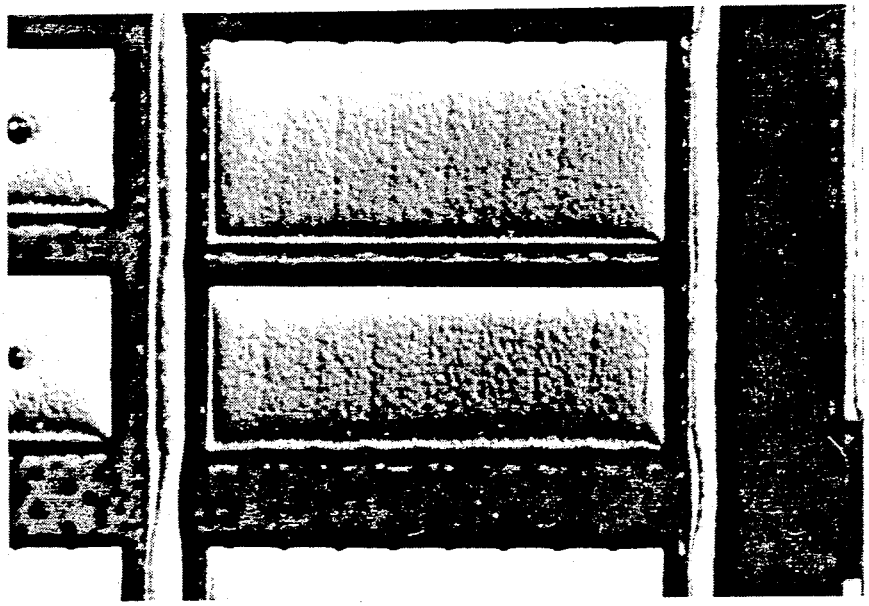
FIG. 10 to 13 illustrate the results of experiments performed on crack formation.
Figure 11:
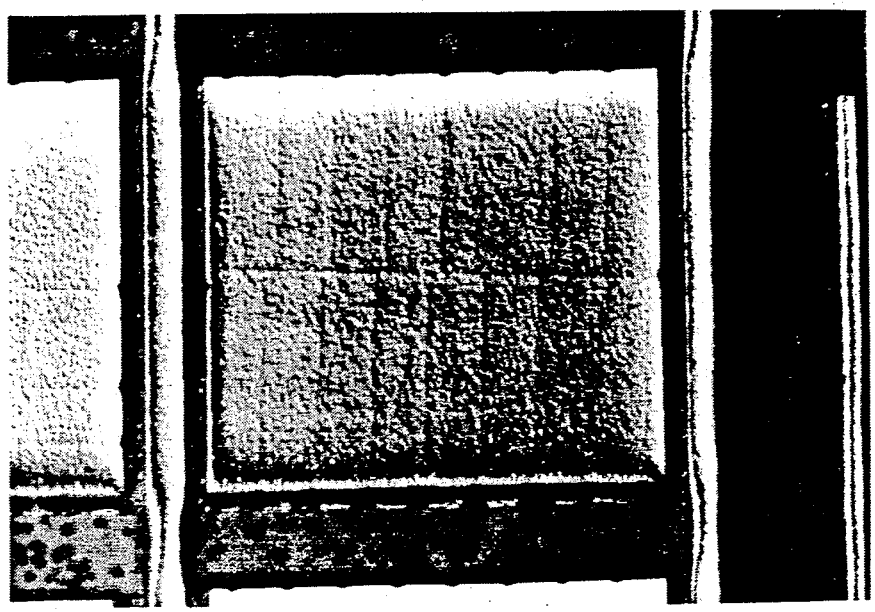
Figure 12:
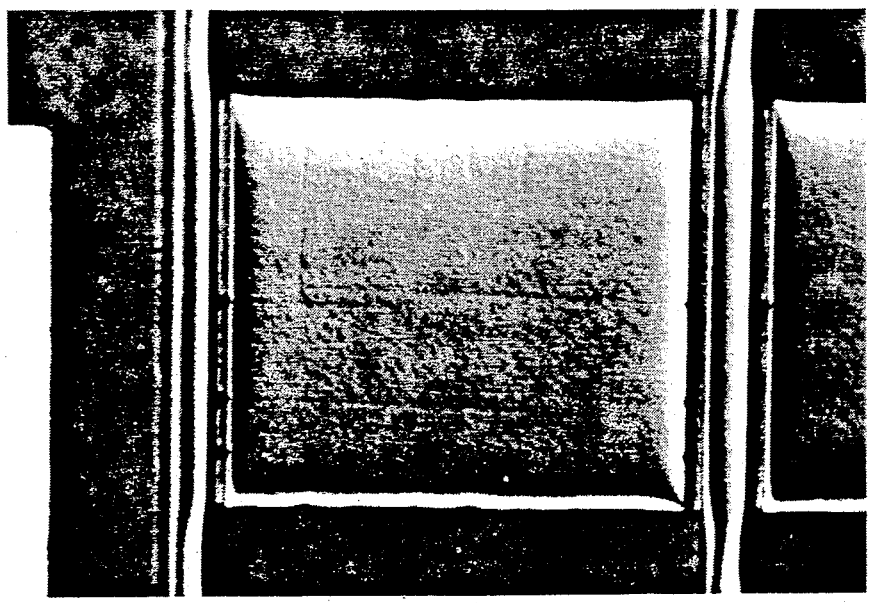
Figure 13:
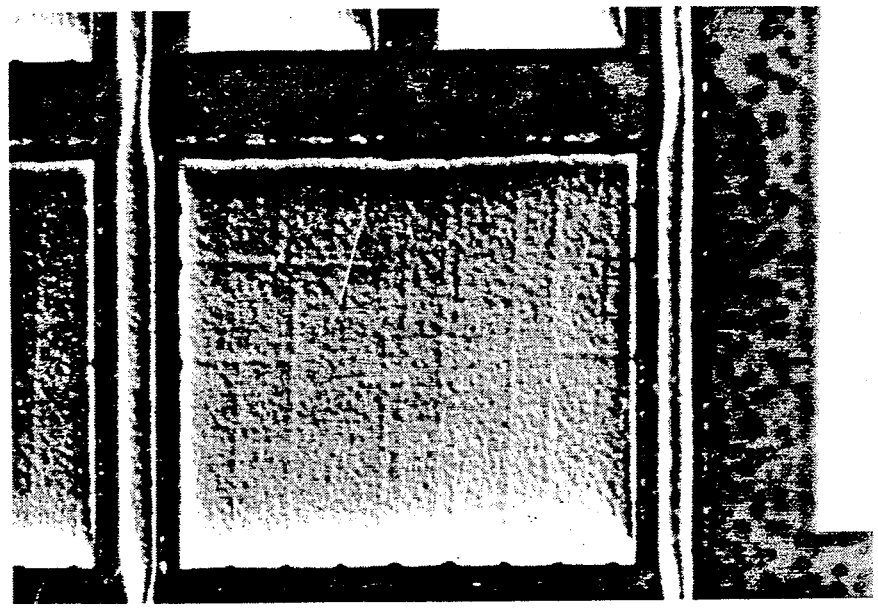

FIG. 9 is an enlarged representation of different shapes of vertices. The angle is varied from approximately 20° to approximately 60°. An alternative form of a vertex is also shown.

The results of experiments on crack formation are shown in reproduced photographs 10 and 13.

In successive growth runs GaAs layers of different thicknesses have been deposited on p-Si substrate using a mask defined in a 100 nanometer thick $SiO_2$ layer.

The crack formation after cooling down of the substrate from growth temperature to room temperature and unloading was studied by means of a Nomarsky interference microscope. The cracks are visible when so observed as very fine lines in the monocrystalline zones.

The grown structures were also immersed in liquid nitrogen (77K) for 30 sec to look at the eventual propagation of crack formation due to enhanced thermal strain at these low temperatures. The cracks are accentuated and better revealed by a very short etch in a $H_2SO_4:H_2O_2:H_2O$ mixture.

Dimensions on the reproduced photographs correspond with dimensions identified on the mask designs of FIGS. 7 and 8.

Reproduced photograph 10 shows a 6 micrometer thick GaAs structure (lower structure). The mask used is represented in FIG. 8*k* and 8*l*. Crack formation starts from the vertices or notches and continues in the cleavage direction. The cracks run parallel. Cracks not initiating from a vertex (i.e. initiating spontaneously) are not found.

Reproduced photograph 11 shows another 6 micrometer thick GaAs structure. The mask used is represented in FIG. 8*f*. Cracks originating at vertices located at the same or a parallel side of the mask run parallel while cracks originating from vertices at perpendicular sides are perpendicular to each other.

A slight constant misorientation (skewing) of approximately 3° can be seen between the cracks and the mask edges. This results from a misorientation of the rectangular Si samples created when they were sawed. As a result, cracks induced from vertices located on opposite sides of the substrate do not exactly meet each other.

Reproduced photographs 12 shows cracks formed on a 3 micrometer thick GaAs structure, whereas reproduced photograph 13 shows cracks formed on a 6 micrometer thick structure. The same mask configuration (cfr. FIG. 8*e*) has been used for both structures.

The cracks show the same behaviour as hereinbefore described.

The number of the cracks crossing the whole monocristalline area however is higher in a 6 micrometer thick structure than in a 3 micrometer thick structure.

Since the mask of FIG. 8*e* is used to obtain the result of reproduced photographs 12 and 13, the influence of the shape of the vertex can also be studied on these reproduced photographs.

No consistent relationship between the shape of the vertices and the resulting crack formation is established in these growth experiments. Experiments have also shown that no particular relationship exists between the interspacing of the vertices and the formation of microcracks. Experiments using the masks of FIGS. 8*g* to *j* show that sharp mask angles in the middle of the growth zone also induce cracks in the epitaxial layer (no reproduced photographs). The masks of FIG. 8*g*, *i*, and *j* induce microcracks in two perpendicular directions whereas by means of the mask of FIG. 8*h*, microcracks are induced in only one cleavage direction (microcracks originate from the sharp angular point).

Experiments hence have established that microcracks can be introduced in the GaAs layer on a Si substrate in a controlled way, i.e. at predetermined locations. The microcracks originate from vertices in a mask and are not found on other locations. The distance between the wedges does not show much influence. The generation of microcracks is generally insensitive to the shape of the vertices and the use of perpendicular opposed wedges results in perpendicular microcracks. Variation of the layer thickness influences the density of microcracks. Also cross, linear and rhomb formations isolated in the middle of the mask-window can generate microcracks.

We claim:

1. In a method for depositing a GaAs crystal layer on a Si substrate, the improvement of controlling the formation of microcracks in said layer by confining such microcracks to at least one predetermined location in said crystal layer by the step comprising prior to the deposition, partially covering said substrate by a mask leaving a generally geometrically shaped window on said Si substrate uncovered for deposition thereon of said crystal layer, said mask defining a boundary around said uncovered window region and including at at least one said predetermined location at least one sharp point projecting into said window region at least approximately in a cleavage direction of the subsequently deposited crystal of said GaAs layer.

2. The method of claim 1, wherein said generally geometrically shaped region has two generally opposite sides and at least one pair of said sharp points are defined by said mask, the points of each pair being situated on two opposite sides of said region at generally opposite predetermined locations.

3. The method of claim 1, wherein said mask includes a portion disposed in the interior of said window region and at least one such sharp point is defined by the interior mask portion.

4. The method of claim 1, wherein at least one such sharp point is located on the outside boundary of said window region.

5. A method according to claim 1 wherein said mask is obtained by deposition of $SiO_2$ on said Si substrate followed by photolithography and wet chemical etching.

6. A method according to claim 1 wherein GaAs is deposited by means of the metal organic chemical vapour deposition technique.

7. A method according to claim 1 wherein in an opening in said mask wherein GaAs is deposited a second mask configuration is provided having at least one such sharp point directed approximately in a cleavage direction of GaAs crystals.

8. In a method of forming an integrated electronic device in at least one defined region of a GaAs crystal layer having an area larger than said region which layer is grown on a masked Si substrate at a given temperature and subsequently cooled, whereby microcracks are formed in said GaAs layer upon such cooling, the improvement of deliberately inducing microcrack formation at at least one location in said GaAs layer outside each such defined region by means of at least one sharp notch created in a side wall of said layer by means of at least one corresponding sharp point provided by said mask at at least one location spaced form said defined region and extending approximately in a cleavage direction of said layer to initiate microcrack formation at said notch whereby said device is not affected by the presence of any such microcracks.

9. The method of claim 8, wherein at least one pair of such notches is created in the side walls of said layer, the notches of each such pair being situated at generally opposite locations on said layer side walls outside said defined region, whereby any microcrack extends between the apices of the notches of one such pair.

10. A method according to claim 8, wherein prior to the growth of said GaAs crystal layer said Si substrate is partially covered by means of a mask to leave uncovered a window of said Si substrate encompassing said defined region for reception of said crystal layer thereon, said mask being configured with a sharp point at at least one locus along its boundary which point projects interiorly of said uncovered window area in a cleavage direction of the crystals of the subsequently grown GaAs layer to thereby create said sharp notch in side wall of the GaAs layer, said locus being outside the defined region of the electronic device.

11. A method according to claim 8, wherein said mask is obtained by deposition of a layer of SiO$_2$ on said Si substrate following by photolithography and wet chemical etching to remove at least one selected window portion of said SiO$_2$ layer to expose at least one corresponding underlying area of said substrate for reception of the GaAs layer thereon.

12. The method of claim 8, wherein at least one such sharp notch is created in an exterior side wall of said GaAs crystal layer.

13. The method of claim 8, wherein said GaAs crystal layer has an interior opening therein defining an interior side wall of said crystal layer and at least one such sharp notch is created in said interior side wall of said crystal layer.

14. A method according to claim 8 wherein GaAs is deposited by means of the metal organic chemical vapour deposition technique.

15. A method according to claim 8 wherein in an opening in said mask wherein GaAs is deposited a second mask configuration is provided having at least one such sharp point directed approximately in a cleavage direction of GaAs crystals.

16. A method of controlling the formation in a GaAs crystal layer deposited on a predetermined generally geometrically shaped window area of a masked Si substrate of microcracks caused during cooling after said deposition by differences in the thermal coefficient of expansion of said layer and substrate, which comprises forming by means of a sharp point provided by said mask at at least one locus along the side walls of said shaped GaAs crystal layer an inwardly extending sharp notch directed substantially along one cleavage direction of said GaAs layer, whereby any such microcrack originates at the point of one such notch.

17. The method of claim 16, wherein one such notch is provided at each of at least one pair of generally opposite loci on the side walls of said shaped layer area, whereby any such microcrack extends between the point of notches at such opposite pairs of loci.

18. The method of claim 16, wherein said shaped GaAs layer has an interior opening therein defining an interior side wall of said crystal layer and at least one such sharp notch is created in said interior side wall of said crystal layer.

19. The method of claim 16, wherein at least one such sharp notch is created in an exterior side wall of said crystal layer.

* * * * *